United States Patent
Mizuhara et al.

(10) Patent No.: US 8,470,090 B2
(45) Date of Patent: Jun. 25, 2013

(54) ALN CRYSTAL AND METHOD FOR GROWING THE SAME, AND ALN CRYSTAL SUBSTRATE

(75) Inventors: Naho Mizuhara, Itami (JP); Michimasa Miyanaga, Itami (JP); Tomohiro Kawase, Itami (JP); Shinsuke Fujiwara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1093 days.

(21) Appl. No.: 11/997,153

(22) PCT Filed: Jul. 10, 2006

(86) PCT No.: PCT/JP2006/313665
§ 371 (c)(1),
(2), (4) Date: Jan. 29, 2008

(87) PCT Pub. No.: WO2007/013286
PCT Pub. Date: Feb. 1, 2007

(65) Prior Publication Data
US 2010/0221539 A1    Sep. 2, 2010

(30) Foreign Application Priority Data

Jul. 29, 2005   (JP) .................................. 2005-220864
May 29, 2006   (JP) .................................. 2006-148663

(51) Int. Cl.
*C30B 23/06*    (2006.01)
(52) U.S. Cl.
USPC .................. 117/99; 117/84; 117/88; 117/89; 117/91; 117/93; 117/100; 117/102; 117/105; 117/109

(58) Field of Classification Search
USPC ............. 117/84, 88–89, 91, 93, 99–100, 102, 117/105, 109, 952
See application file for complete search history.

(56) References Cited

U.S. PATENT DOCUMENTS

| 6,001,748 | A  | * | 12/1999 | Tanaka et al. | ................. | 438/791 |
| 6,485,563 | B2 | * | 11/2002 | Kawase et al. | ................. | 117/73 |
| 2003/0176001 | A1 | * | 9/2003 | Fukuyama et al. | ............. | 438/22 |

FOREIGN PATENT DOCUMENTS

| JP | H10-053495 A | 2/1998 |
| JP | 2001-072491 A | 3/2001 |
| JP | 2004-137142 A | 5/2004 |
| JP | 2004-200362 A | 7/2004 |

OTHER PUBLICATIONS

E.N. Mokhov, et al. in "Sublimation growth of AlN bulk crystals in Ta crucibles," J. Cryst. Growth, vol. 281, pp. 93-100, available online Apr. 15, 2005.*

(Continued)

*Primary Examiner* — Michael Kornakov
*Assistant Examiner* — Kenneth A Bratland, Jr.
(74) *Attorney, Agent, or Firm* — James W. Judge

(57) ABSTRACT

Affords large-diametric-span AlN crystals, applicable to various types of semiconductor devices, with superior crystallinity, a method of growing the AlN crystals, and AlN crystal substrates. The AlN crystal growth method is a method in which an AlN crystal (4) is grown by vapor-phase epitaxy onto a seed crystal substrate (2) placed inside a crystal-growth compartment (24) within a crystal-growth vessel (12) provided within a reaction chamber, and is characterized in that during growth of the crystal, carbon-containing gas is supplied to the inside of the crystal-growth compartment (24).

3 Claims, 3 Drawing Sheets

OTHER PUBLICATIONS

V. Noveski, et al. in "Seeded growth of bulk AlN crystals and grain evolution in polycrystalline AlN boules," J. Cryst. Growth, vol. 279, pp. 13-19, Available online Mar. 29, 2005.*

A publication to V. Noveski, et al. entitled "Seeded growth of bulk AlN crystals and grain evolution in polycrystalline AlN boules," J. Cryst. Growth, vol. 379, pp. 13-19, published online on Mar. 29, 2005.*

A publication to V. Noveski, et al. entitled "Seeded growth of bulk AlN crystals and grain evolution in polycrystalline AlN boules," J. Cryst. Growth, vol. 279, pp. 13-19, published online on Mar. 29, 2005.*

A publication to E.N. Mokhov, et al. entitled "Sublimation growth of AlN bulk crystals in Ta crucibles," J. Cryst. Growth, vol. 281, pp. 93-100, which was available online on Apr. 15, 2005.*

V. Noveski et al., "Seeded Growth of Bulk AlN Crystals and Grain Evolution in Polycrystalline AlN Boules," Journal of Crystal Growth, May 15, 2005, pp. 13-19, vol. 279, Elsevier, Amsterdam, NL.

V. Noveski et al., "Growth of AlN Crystals on AlN/SiC Seeds by AlN Powder Sublimination in Nitrogen Atmosphere," MRS Internet Journal Nitride Semiconductor Research, Feb. 9, 2004. The Materials Research Society, Warrendale, PA.

Lianghong Liu et al., "Growth Mode and Defects in Aluminum Nitride Sublimed on (0001) 6H-SiC Substrates," MRS Internet Journal Nitride Semiconductor Research, Jul. 6, 2001, The Materials Research Society, Warrendale, PA.

R. Dalmau et al., "Polarity and Morphology in Seeded Growth of Bulk AlN on SiC," Physica Status Solidi (C), Feb. 8, 2005, pp. 2036-2039, No. 7, Wiley-VCH, DE.

E.N. Mokhov et al., "Sublimation Growth of AlN Bulk Crystals in Ta Crucibles," Journal of Crystal Growht, Apr. 15, 2005, pp. 93-100, vol. 280, No. 1, Elsevier, Amsterdam, NL.

J. Senawiratne et al., "Raman, Photoluminescence and Absorption Studies on High Quality AlN Single Crystals," Physica Status Solidi (C), Apr. 1, 2005, pp. 2774-2778, No. 7, Wiley-VCH, DE.

* cited by examiner

ND METHOD FOR
AlN CRYSTAL AND METHOD FOR GROWING THE SAME, AND AlN CRYSTAL SUBSTRATE

TECHNICAL FIELD

The present invention relates to large-diametric-span AlN crystals of satisfactory crystallinity, applicable to various types of semiconductor devices, to methods of growing the AlN crystals, and AlN crystal substrates.

BACKGROUND ART

Owing to their distinguished semiconductor properties, AlN crystals are extremely useful as materials for creating a variety of semiconductor devices, including light-emitting devices, electronic devices, and semiconductor sensors. For this reason, growing large-diametric-span AlN crystals having superior crystallinity has become crucial.

Examples that have been proposed of how to grow such AlN crystals include a variety of vapor-phase growth methods, such as sublimation, hydride vapor-phase epitaxy (HVPE), molecular beam epitaxy (MBE), and metalorganic chemical vapor deposition (MOCVD). Among these methods, sublimation in particular is preferably employed, from the perspectives that the method can yield AlN crystal of favorable crystallinity and small full-width at half maximum in X-ray diffraction, and that the growth rates are high. Herein, "sublimation" means a technique in which crystal is grown by sublimating and afterwards re-solidifying the crystal source materials.

In sublimation, compound semiconductor substrates composed of compound semiconductors such as GaN and SiC are utilized as seed crystal substrates. Particularly, from the perspectives that the AlN and SiC seed crystals exhibit close lattice matching with the grown AlN crystals and that they have outstanding heat-resistance, AlN crystal growth on seed crystal substrates composed of AlN or SiC has been studied. (For example, cf. Non-Patent References 1 and 2).

In the above AlN crystal sublimation growth, producing large-diametric-span AlN crystals having superior crystallinity has been challenging mainly because areas in which AlN crystal does not grow ("crystal non-growth areas" hereinafter) are present on the AlN and SiC seed crystal substrates and other compound semiconductor substrates. Furthermore, particularly in the situation in which the SiC seed crystal substrate top is employed, the fact that the temperature at which the SiC crystals sublimate is 2300° C. is prohibitive of raising the temperature at which the AlN crystals grow, which has caused AlN crystal growth rates to drop.

Non-Patent Reference 1: V. Noveski, "Growth of AlN crystals on AlN/SiC seeds by AlN powder sublimation in nitrogen atmosphere," MRS Internet J. Nitride Semicond. Res. 9, 2 (2004).

Non-Patent Reference 2: Lianghong Liu, "Growth Mode and Defects in Aluminum Nitride Sublimed on (0001) 6H—SiC Substrates," MRS Internet J. Nitride Semicond. Res. 6, 7 (2001).

DISCLOSURE OF INVENTION

Problems to be Solved by the Invention

The present invention is directed to solving these problems, and an object of the invention is to make available large-diametric-span AlN crystals having superior crystallinity, applicable to various types of semiconductor devices, methods of growing the AlN crystals, and AlN crystal substrates.

Means to Solve the Problem

One aspect of the present invention is a method of growing an AlN crystal onto a seed crystal substrate placed in a crystal-growth compartment in a crystal-growth vessel provided in a reaction chamber, the method being characterized in that carbon-containing gas is supplied to the crystal-growth compartment during crystal growth.

In a AlN crystal growth method involving the present invention, as a seed crystal substrate, a SiC seed crystal substrate or an AlN seed crystal substrate can be utilized. Furthermore, the ratio of the carbon-containing gas partial pressure to the total pressure during crystal growth in the reaction chamber can be made $2 \times 10^{-5}$ to 0.9 inclusive. Moreover, the carbon-containing gas can be generated from a reaction between carbon and an AlN source. Further still, as a carbon supply source for producing the carbon-containing gas, graphite forming the crystal-growth vessel can be utilized. Additionally, the carbon-containing gas can include a CO or $CO_2$ gas. It should be understood that the CO and $CO_2$ gases can be produced from a reaction between carbon and a metal oxide. The carbon-containing gas also can be supplied from outside the reaction chamber. Herein, the externally supplied carbon-containing gas can include a CO or $CO_2$ gas.

The present invention in another aspect is an AlN crystal, produced by any of above growth methods, having a carbon atom concentration of $1 \times 10^{15}$ atoms·cm$^{-3}$ to $1 \times 10^{20}$ atoms·cm$^{-3}$ inclusive, and having a diameter of 25.4 mm or more. In the AlN crystal involving the present invention, its diameter can be brought to 48.8 or more.

A further aspect of the present invention is an AlN crystal substrate obtained by processing above AlN crystal.

Advantageous Effect of the Invention

The present invention affords a large-diametric-span AlN crystal having superior crystallinity, methods of growing the AlN crystal, and an AlN crystal substrate.

LEGEND

Figure 1:
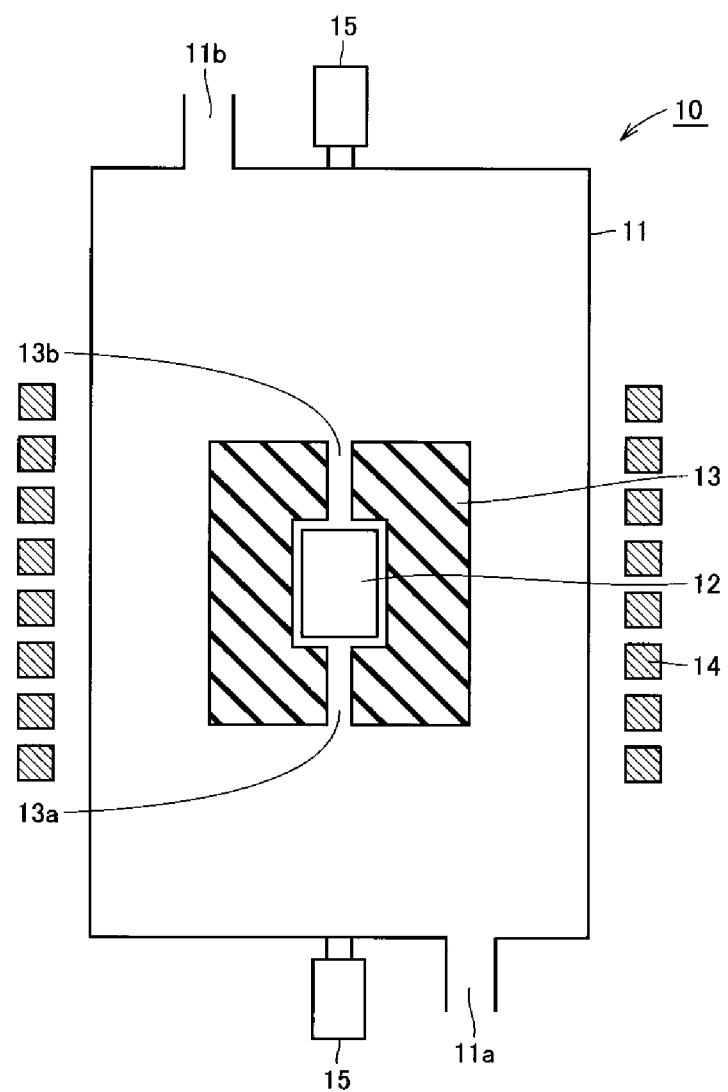
FIG. 1 is a schematic diagram of an outline of the sublimation furnace employed in an AlN crystal growth method involving the present invention.

1: AlN source; 2: seed crystal substrate; 3: metal oxide; 4: AlN crystal; 10: sublimation furnace; 11: reaction chamber; 11*a*: gas inlet; 11*b*: gas outlet; 12: crystal-growth vessel; 12*h*, 13*a*, 13*b*, 21*h*: opening parts; 12*s*: inner wall; 13: heat insulating material; 14: high-frequency heating coil; 15: radiation thermometer; 21: high-temperature-tolerant material; 23: carbon-containing gas producing compartment; 24: crystal-growth compartment.

BEST MODE FOR CARRYING OUT THE INVENTION

The AlN crystal growth method involving the present invention is a method of, referring to FIGS. 1 through 4, growing by vapor-phase epitaxy an AlN crystal 4 onto a seed crystal substrate 2 placed in a crystal-growth compartment 24 in a crystal-growth vessel 12 provided in a reaction chamber 11, the method being characterized in that carbon-containing gas is supplied to the inside of the crystal-growth compartment 24 during crystal growth. Supplying the inside of the crystal-growth compartment 24 with the carbon-containing gas to eliminate the area on the seed crystal substrate 2 in which crystals do not grow, and growing the AlN crystal 4 across the entire front side of the seed crystal substrate 2, make it possible to grow the large-diametric-span AlN crystal 4 having superior crystallinity.

Herein, the seed crystal substrate 2 is not particularly limited as long as it is the substrate on which the AlN crystal 4 can be grown, but from the perspective of the close lattice match to the grown AlN crystal 4, a SiC seed crystal substrate or an AlN seed crystal substrate is preferable. Herein, SiC seed crystal substrates are suited to growing AlN crystal of superior crystallinity at larger diametric spans, because for seed crystal substrates of diametric span larger than AlN seed crystal substrates, they are more readily available. Furthermore, AlN seed crystal substrates are suited to growing AlN crystal of more favorable crystallinity, because of their still closer lattice match to the AlN crystal than SiC seed crystal substrates.

An AlN crystal growth method involving the present invention is applicable to various vapor-phase epitaxy methods including sublimation, HVPE, MBE, and MOCVD as long as the growth method is not contrary to its purpose. Hereinafter, sublimation will be explained as a most representative example of a method for growing AlN crystal.

Sublimation means a method in which a crystal source material is solidified again after sublimated, and crystal is grown, and for example, referring to FIG. 1, a sublimation furnace 10 is employed. The sublimation furnace 10 is a vertical sublimation furnace of high-frequency heating type, and the crystal-growth vessel 12 for which ventilation with the exterior is secured is provided centrally in the reaction chamber 11, with a heat insulating material 13, having opening parts 13a and 13b, for which external ventilation is secured being provided around the crystal-growth vessel 12. Moreover, high-frequency heating coils 14 for heating the crystal-growth vessel 12 are provided centrally along the outer side of the reaction chamber 11. Additionally, a gas inlet 11a and gas outlet 11b for supplying the outside of the crystal-growth vessel 12 with nitride gas and radiation thermometers 15 for measuring temperatures of the top and bottom faces of the crystal-growth vessel 12 are provided to the ends of the reaction chamber 11.

Figure 2:
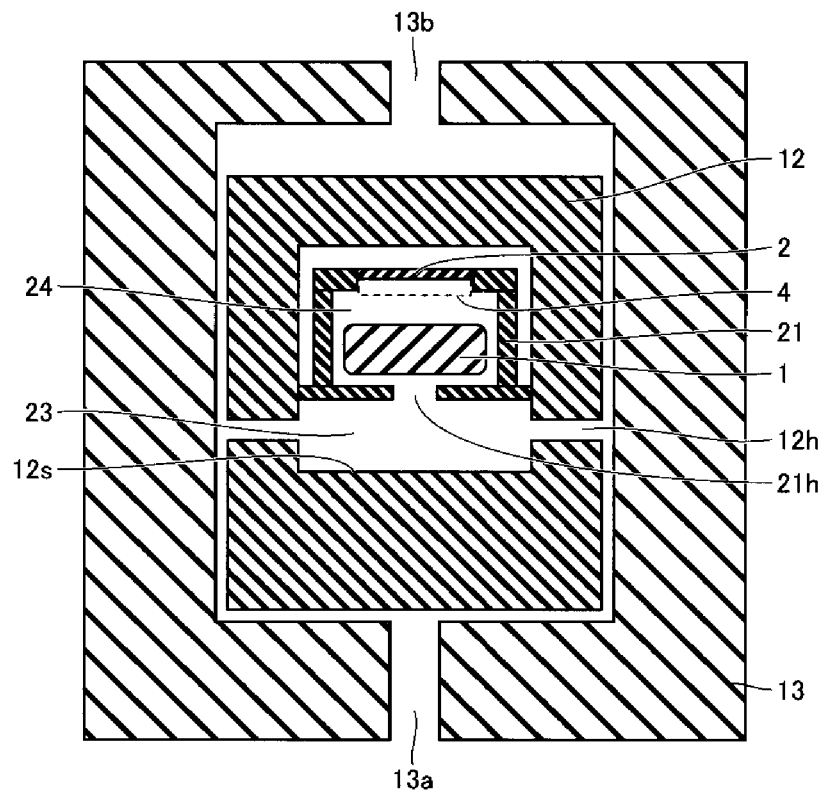
FIG. 2 is a cross-sectional schematic view of one example of the structure of a crystal-growth vessel in the sublimation furnace employed in one embodiment of the AlN crystal growth method involving the present invention.
Figure 3:
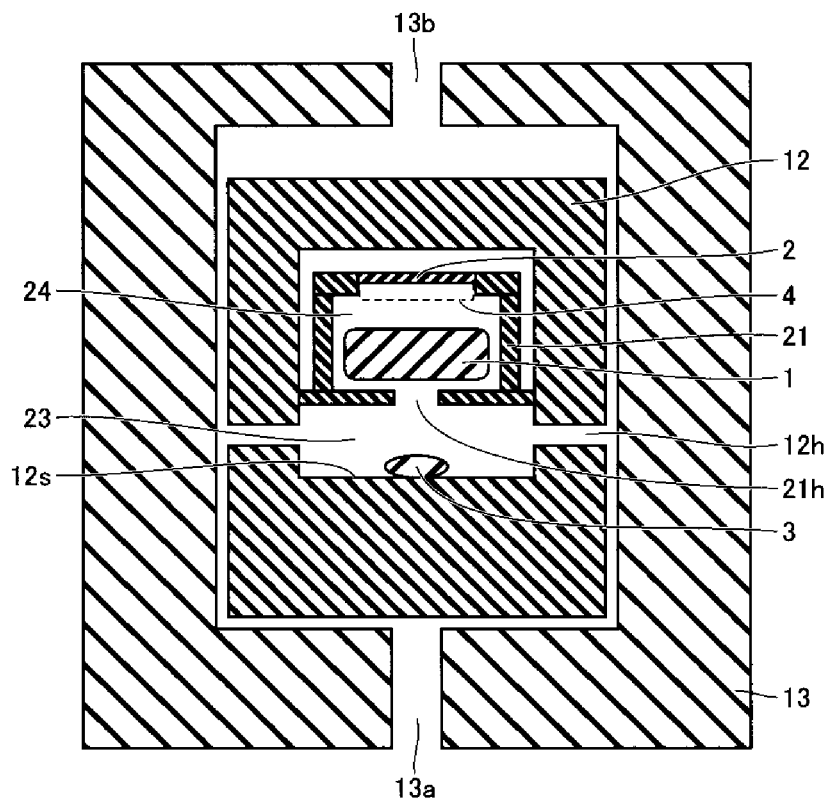
FIG. 3 is a cross-sectional schematic view of one example of the structure of the crystal-growth vessel in the sublimation furnace employed in another embodiment of the AlN crystal growth method involving the present invention.
Figure 4:
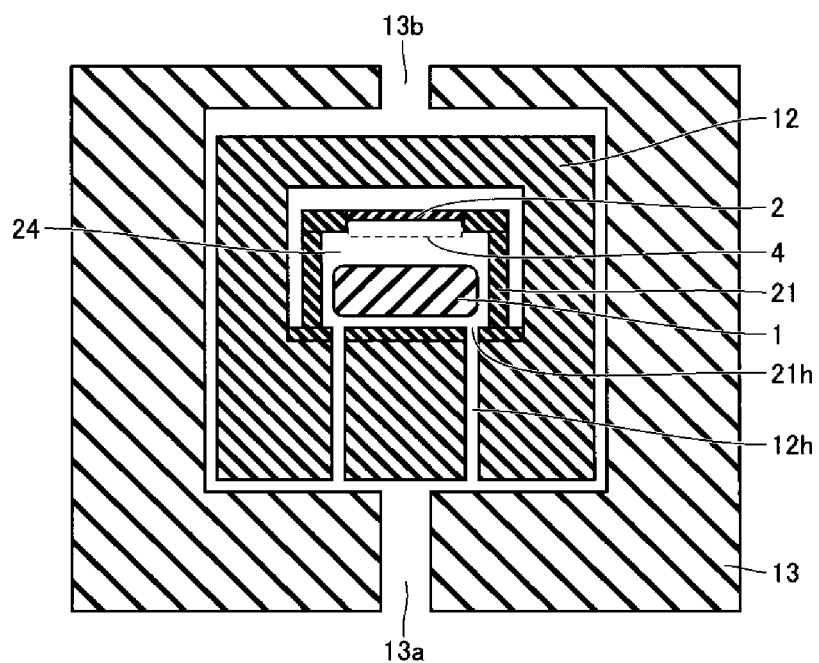
FIG. 4 is a cross-sectional schematic view of one example of the structure of the crystal-growth vessel in the sublimation furnace employed in yet another embodiment of the AlN crystal growth method involving the present invention.

Furthermore, referring to FIGS. 2 through 4, the crystal-growth compartment 24 composed of a refractory metal such as Ta, W, or of a high-temperature-tolerant material 21 such as metal carbide including TaC and WC is provided in the crystal-growth vessel 12, and an AlN source 1 is placed to one of the ends of the crystal-growth compartment 24, with the seed crystal substrate 2 is placed to the other. Herein, ventilation is secured by opening parts 21h, 12h, 13a, and 13b for the inside of the crystal-growth compartment 24, and for the inside and outside of the crystal growth vessel 12. What the difference is among FIGS. 2 through 4 will be explained hereinafter.

Referring to FIGS. 1 through 4, the AlN crystal is grown employing the sublimation furnace 10, for example, in the following manner. With the AlN source 1 being placed to one of the ends of the crystal-growth compartment 24 in the crystal-growth vessel 12, and the seed crystal substrate 2 being placed to the other, the AlN source 1 is sublimated by raising, while the reaction chamber 11 is being supplied with nitrogen gas, the temperature in the crystal-growth compartment 24 employing the high-frequency heating coils 14 to keep the temperature of the end where the AlN source 1 is placed higher than that of the end where the seed crystal substrate 2, and the AlN source 1 is solidified again on the seed crystal substrate 2 to grow AlN crystals.

In the AlN crystal growth method involving the present invention, the ratio of the carbon-containing gas partial pressure to the total pressure of the gas in crystal growth in the reaction chamber 11 is preferably between from $2 \times 10^{-5}$ and 0.9 inclusive. In the situation in which the ratio of the carbon-containing gas partial pressure is less than $2 \times 10^{-5}$, or exceeds 0.9, the grown AlN crystal is prone to suffer adversely affected morphology and polycrystallization. Herein, the carbon-containing gas concentration (that equals the ratio of the partial pressure) in the gas in the reaction chamber can be measured employing a quadrupole mass spectrometer.

The carbon-containing gas employed in the AlN crystal growth method involving the present invention is not particularly limited, but from the perspective of eliminating crystal non-growth areas from the seed crystal substrate 2 to efficiently grow the large-diametric-span AlN crystal having superior crystallinity, the carbon-containing gas preferably includes CO gas or $CO_2$ gas, and more preferably, it is CO gas or $CO_2$ gas. In particular, the CO gas is preferable from above perspective.

Moreover, in the AlN crystal growth method involving the present invention, referring to FIGS. 1 through 4, carbon-containing gas supply source is preferably graphite forming the crystal-growth vessel 12. Employing as the crystal-growth vessel 12 a graphite crucible having high temperature tolerance and mechanical strength, AlN gas source generated from the AlN source 1 (FIG. 2) or metal oxide gas generated from a metal oxide 3 (FIG. 3) is reacted with carbon in the graphite crucible (the crystal-growth vessel 12) to produce the carbon-containing gas.

Herein, the modes by which the carbon-containing gas is supplied to the inside of the crystal-growth compartment 24 will be explained more specifically.

Embodiment Mode 1

This embodiment mode is characterized in that, referring to FIGS. 1 and 2, the carbon-containing gas produced from a reaction between the carbon in the graphite crucible (the crystal-growth vessel 12) forming inner walls of a carbon-containing gas producing compartment 23 and the AlN gas source generated from the AlN source 1 placed in the crystal-growth compartment 24 is supplied to the inside of the crystal-growth compartment 24.

In this embodiment mode, referring to FIG. 2, the crystal-growth compartment 24 walled with the high-temperature-tolerant material 21 and the carbon-containing gas producing compartment 23 walled with the high-temperature-tolerant material 21 and crystal-growth vessel 12 are formed within the crystal-growth vessel 12 (graphite crucible). Herein, the air is circulated via opening part 21h through the crystal-growth compartment 24 and the carbon-containing gas producing compartment 23, and is circulated via the opening parts 12h, 13a, and 13b through the carbon-containing gas producing compartment 23 and the outside of the crystal-growth vessel 12. Herein, via the opening part 21h, the crystal-growth compartment 24 communicates with the carbon-containing gas producing compartment 23 for ventilation and via the opening parts 12h, 13a, and 13b, the carbon-containing gas producing compartment 23 communicates with the outside of the crystal-growth vessel 12 for ventilation.

In this embodiment mode, referring to FIGS. 1 and 2, the AlN gas source is generated from the AlN source 1 placed in the crystal-growth compartment 24 under a high-temperature (for example, of around 1700° C. to 2300° C.) atmosphere by heating the crystal-growth vessel 12, carbon-containing gas producing compartment 23, and crystal-growth compartment 24, with the AlN source 1 being placed to one of the ends of the crystal-growth compartment 24 where the opening 21h is present, and the seed crystal substrate 2 being placed to the other, while the inside of the reaction chamber 11 (the outside of the crystal growth vessel 12) is being supplied with nitride gas as carrier gas. The AlN gas source enters via the opening part 21h the carbon-containing gas producing compartment 23, and reacts with the carbon in the graphite of the crystal-growth vessel 12 (graphite crucible) forming inner walls 12s of the carbon-containing gas producing compartment 23 to produce the carbon-containing gas. Together with $N_2$ (nitride) gas entering via the openings 13a, 13b, 12h the crystal-growth vessel 12 from outside the crystal-growth vessel 12, carbon-containing gas is supplied via the opening part 21h to the crystal-growth compartment 24. Supplying the inside of the crystal-growth compartment 24 with carbon-containing gas in this manner brings the carbon-containing gas in AlN crystal growth in the crystal-growth compartment 24 to above a predetermined amount. Furthermore, varying the diameter of the opening 21h can increase and decrease the amount of the carbon-containing gas supplied to the crystal-growth compartment 24. That is, the amount of the carbon-containing gas supplied to the inside of the crystal-growth compartment 24 increases with the increasing diameter of the opening part 21h.

In the crystal-growth compartment 24, sublimation of the AlN source 1 generates AlN gas source, and the solidification of the AlN gas source leads to growth of the AlN crystal 4 on the seed crystal substrate 2. In this crystal growth, the carbon-containing gas supplied to the crystal-growth compartment 24 eliminates the (not-illustrated) crystal non-growth areas on the seed crystal substrate 2, and the AlN crystal 4 grows across the front side of the seed crystal substrate 2. As a result, the large-diametric-span AlN crystal having superior crystallinity can be achieved.

Embodiment Mode 2

This embodiment mode is characterized in that, referring to FIGS. 1 and 3, CO gas and/or $CO_2$ gas produced from the reaction between the carbon in the graphite crucible (the crystal-growth vessel 12) forming the inner wall of the carbon-containing gas producing compartment 23, and the metal oxide gas generated from the metal oxide 3 placed in the carbon-containing gas producing compartment 23 is supplied as the carbon-containing gas to the inside of the crystal-growth compartment 24.

In this embodiment mode, referring to FIG. 3, as in Embodiment Mode 1, the crystal-growth compartment 24 walled with the high-temperature-tolerant material 21, and the carbon-containing gas producing compartment 23 walled with the high-temperature-tolerant material 21 and with the crystal-growth vessel 12, are formed within the crystal-growth vessel 12 (graphite crucible). Herein, the air is circulated via the opening part 21h through the crystal-growth compartment 24 and the carbon-containing gas producing compartment 23, and is circulated via the opening parts 12h, 13a, 13b through the carbon-containing gas producing compartment 23 and the outside of the crystal-growth vessel 12. Herein, via the opening part 21h, the crystal-growth compartment 24 communicates with the carbon-containing gas producing compartment 23 for ventilation and via the opening parts 12h, 13a, and 13b, the carbon-containing gas producing compartment 23 communicates with the outside of the crystal-growth vessel 12 for ventilation.

This embodiment mode is similar to Embodiment Mode 1 in that, referring to FIGS. 1 and 3, the AlN source 1 is placed to one of the ends of the crystal-growth compartment 24 where the opening part 21h is present, and the seed crystal substrate 2 is placed to the opposite end of the crystal-growth compartment 24 from the end where the opening part 21h is present, and is different from Embodiment Mode 1 in that the metal oxide 3 is further placed in the carbon-containing gas producing compartment 23. Herein, the metal oxide is not particularly limited as long as it is the metal oxide that reacts with carbon to produce CO gas and/or $CO_2$ gas, but from the perspective of producing the CO gas and/or $CO_2$ gas without adversely affecting the crystallinity of the AlN crystal, $Al_2O_3$ is one of the preferable examples of the metal oxide.

As a result of heating the crystal-growth vessel 12, carbon-containing gas producing compartment 23 and crystal-growth compartments 24 while the reaction chamber 11 (the outside of the crystal-growth vessel 12 in FIG. 3) is being supplied with nitride gas as carrier gas, the metal oxide gas is generated from the metal oxide 3 placed in the carbon-containing gas producing compartment 23 under a high-temperature (for example, of about 1700° C. to 2300° C.) atmosphere. The metal oxide gas reacts with the carbon in the graphite of which the crystal-growth vessel 12 (graphite crucible) forming the inner wall 12s of the carbon-containing gas producing compartment 23, producing the CO gas and/or $CO_2$ gas as the carbon-containing gas. Together with the $N_2$ (nitride) gas entering the crystal-growth vessel 12 via the opening parts 13a, 13b, and 12h from outside the crystal-growth vessel 12, the CO gas and/or $CO_2$ gas is supplied via the opening part 21h to the crystal-growth compartment 24. Supplying the inside of the crystal-growth compartment 24 with the CO gas and/or $CO_2$ gas in this manner brings the CO gas and/or $CO_2$ gas in crystal-growth compartment 24 in AlN crystal growth to above a predetermined amount. Furthermore, varying the diameter of the opening part 21h increases and decreases the amount of the CO gas and/or $CO_2$ gas supplied to the inside of the crystal-growth compartment 24. That is, lengthening the diameter of the opening part 21h increases the amount of the CO gas and/or $CO_2$ gas supplied to the inside of the crystal growth compartment 24.

In the crystal-growth compartment 24, sublimation of the AlN material 1 generates the AlN gas source, the solidification of the AlN gas source leads to the growth of the AiN crystal 4 on the seed crystal substrate 2. In this crystal growth, the CO gas and/or $CO_2$ gas supplied to the inside of the crystal-growth compartment 24 eliminates the (not-illustrated) crystal no-growth areas, on the seed crystal substrate 2, and the AlN crystal 4 grows across the front side of the seed crystal substrate 2. As a result, large-diametric-span AlN crystal having superior crystallinity can be obtained.

Embodiment Mode 3

This embodiment mode is the mode by which the inside of the crystal-growth compartment 24 in the crystal-growth vessel provided in the reaction chamber 11 is directly supplied with the carbon-containing gas from outside the reaction chamber 11. Herein, the carbon-containing gas is supplied together with the carrier gas in order to control the carbon content in the gas supplied to the inside of a crystal-growth room 4. As the carrier gas, an $N_2$ (nitride) gas and other gases that do not react with the carbon-containing gas are utilized. Furthermore, the carbon-containing gas is not particularly limited, but from the perspective of eliminating the area where crystals do not grow, on the seed crystal substrate 2, to efficiently grow large-diametric-span AlN crystals having superior crystallinity, the CO gas and/or $CO_2$ gas is preferably employed. In this embodiment mode, referring to FIG. 4, the crystal-growth compartment 24 walled with the high-temperature-tolerant material 13 is formed within the crystal-growth vessel 12 (that may not be graphite crucible). Via the opening parts 21h, 12h, 13a, and 13b, the crystal-growth compartment 24 communicates with the outside of the crystal-growth vessel 12 for ventilation.

In this embodiment mode, referring to FIGS. 1 and 4, with the AlN source 1 being placed to one of the ends of the crystal-growth compartment 24, where the opening part 21h is present, and the seed crystal substrate 2 being placed to the other, the inside of the reaction chamber 11 (the outside of the crystal-growth vessel 12 in FIG. 3) is supplied with $N_2$ gas, and with CO gas or $CO_2$ gas. The supplied $N_2$ gas and CO gas or $Co_2$ gas are supplied via the opening parts 13a, 13b, 12h, and 21h to the inside of the crystal-growth compartment 24.

In the crystal-growth compartment 24, sublimation of the AlN source 1 generates the AlN gas source, and the solidification of the AlN gas source leads to growth of the AlN crystal 4 on the seed crystal substrate 2. In this crystal growth, the CO gas or $CO_2$ gas supplied to the inside of the crystal-growth compartment 24 eliminates the (not illustrated) area where crystals do not grow, on the seed crystal substrate 2, and the AlN crystal 4 grow across the front side of the seed crystal substrate 2. As a result, large-diametric-span AlN crystal having superior crystallinity can be obtained.

Embodiment Mode 4

The AlN crystal of this embodiment mode, which are produced by the growth methods of the Embodiment Modes 1 through 3, is $1\times10^{15}$ atoms·$cm^{-3}$ to $1\times10^{20}$ atoms·$cm^{-3}$ inclusive in carbon atom concentration in crystal, and is 25.4 mm or more in diameter. Bringing the carbon atom concentration in crystal to within the range from $1\times10^{15}$ atoms·$cm^{-3}$ to $1\times10^{20}$ atoms·$cm^{-3}$ inclusive makes it possible to design large-diametric-span AlN crystals that differ in conductivity, so that the AlN crystals are widely applied to various types of semiconductor devices. Form the perspective of making the crystal diameter still greater, the AlN crystal of this embodiment mode is preferably 48.8 mm or more in diameter. Additionally, from the perspective of enhancing the crystallinity, the AlN crystal of this embodiment is preferably between $1\times10^{17}$ atoms·$cm^{-3}$ and $1\times10^{19}$ atoms·$cm^{-3}$ inclusive in crystal carbon atom concentration. It should be understood that the crystal carbon atom concentration can be measured by secondary ion mass spectroscopy (SIMS).

Embodiment Mode 5

The AlN crystal substrate in this embodiment mode is produced by processing the AlN crystal in Embodiment Mode 3. Herein, the processing means that a substrate with a predetermined thickness is cut from the AlN crystal, and its front side is surface-treated. The surface-treatment means that in addition to polishing of the front side, a damaged layer caused by the polishing is removed. The AlN substrate produced in this manner can be widely applied to various types of semiconductor devices.

EMBODIMENTS

Embodiment 1

This embodiment is an example corresponding to Embodiment Mode 2. Referring to FIG. 3, the AlN crystal was grown employing crystal-growth compartment 24 that is 60 mm in inner diameter×70 mm in height, and a graphite crucible provided as the crystal-growth vessel 12 within the carbon-containing gas producing compartment 23 that is 60 mm in inner diameter×10 mm in height. Herein, the diameter of the opening part 21h between the crystal-growth compartment 24 and the carbon-containing gas producing compartment 23 was 8 mm, that of the opening part 12h of the carbon-containing producing compartment 23 (a part of the crystal-growth vessel 12) was 3 mm, and that of the opening parts 13a and 13b of the heat insulating material 13 was 5 mm.

First, the AlN source 1 of 30 g was placed to one (under side) of the ends of the crystal-growth compartment 24 where the opening part 21h was present, and a H—SiC seed crystal substrate 50.8 mm in diameter×0.5 mm in thickness (the surface on which crystals are grown is the (0001) face (Si face)) was placed as the seed crystal substrate 2 to the other (top side). Furthermore, 3 g of $Al_2O_3$ powder as the metal oxide 3 was placed inside the carbon-containing gas producing compartment 23.

Next, referring to FIGS. 1 and 3, $N_2$ gas was supplied to the inside of the reaction chamber 11 (the outside of the crystal-growth vessel 12) at flow rate of 200 sccm (the unit ($cm^3$/min) of gas volume flow in standard condition of 0° C., 1013 hPa) to bring the pressure in the reaction chamber 11 to 931 hPa (700 Torr), and the crystal-growth vessel 12, carbon-containing gas generating compartment 23, and crystal-growth compartment 24 were heated to bring the temperature (corresponding to the temperature at which the AlN source 1 was sublimated) of the under side of the crystal-growth vessel 12 to 2000° C., and to bring the temperature (corresponding to the temperature at which the AlN crystal 4 was grown) of the top side of the crystal-growth vessel 12 to 1900° C., and then the AlN crystal was grown. The time required to grow the crystal was 30 hours. After the crystal growth, the AlN crystal was cooled to room temperature (for example, 25° C.), and then was removed from the crystal-growth compartment 24.

The produced AlN crystal, which was 48.8 mm in diameter×3 mm in thickness, was large in diameter, and was a single crystal with favorable morphology. The crystallinity of this AlN single crystal was also superior because the full-width at half-maximum of its diffraction peaks in an XRD (X-ray diffraction) rocking curve along its (0002) face was 100 arcsec. Moreover, the carbon atom concentration in the AlN crystal measured $6\times10^{18}$ atoms·$cm^{-3}$ by SIMS.

Embodiment 2

This embodiment is an example corresponding to above Embodiment Mode 1. Apart from not placing the (not-illustrated) metal oxide, referring to FIG. 2, in the carbon-containing gas producing compartment 23, the AlN crystal was grown in the same manner as in Embodiment 1.

The produced AlN crystal, which was 48.8 mm in diameter×3 mm in thickness, was large in diameter, and was a single crystal with preferable morphology. The crystallinity of this AlN single crystal was also preferable because the full-width at half-maximum of diffraction peak in an XRD (X-ray diffraction) rocking curve along its (0002) face was 100 arcsec. Moreover, the carbon atom concentration in the AlN crystal was $2\times10^{18}$ atoms·cm$^{-3}$.

Embodiment 3

This embodiment was an example corresponding to above First Embodiment Mode 1. Apart from not placing the (not-illustrated) metal oxide in the carbon-containing gas producing compartment 23, and apart from employing as the seed crystal substrate 2 an AlN seed crystal substrate (the surface on which crystals were grown was the (0002) face) 50.8 mm in diameter×0.5 mm in thickness, referring to FIG. 2, the AlN crystal was grown in the same manner in Embodiment 1.

The produced AlN crystal, which was 48.8 mm in diameter×3 mm in thickness, was large in diameter, and was a single crystal with preferable morphology. The crystallinity of this AlN single crystal was also preferable because the full-width at half-maximum of diffraction peak in an XRD (X-ray diffraction) rocking curve along its (0002) face was 50 arcsec. Moreover, the carbon atom concentration in the AlN crystal was $5\times10^{17}$ atoms·cm$^{-3}$.

Embodiment 4

This embodiment is an example corresponding to Embodiment Mode 3. Referring to FIG. 4, the AlN crystal was grown employing a graphite crucible provided as the crystal-growth vessel 12 in the crystal-growth compartment 24 that is 60 mm in inner diameter×70 mm in height. Herein, the diameter of the opening part 21h of the crystal-growth compartment 24 was 3 mm, that of the opening part 12h of the crystal-growth vessel 12 was 3 mm, and that of the opening parts 13a and 13b of the heat-insulating material 13 was 5 mm.

First, the AlN material of 30 g was placed to one of the ends (the under side) of the crystal-growth compartment 24 where the opening part 21 was present, and a H—SiC seed crystal substrate (the surface on which crystals were grown was the (0001) face (Si) face) 50.8 mm in inner diameter×0.5 mm in thickness was placed as the seed crystal substrate 2 to the other (the top side).

Next, referring to FIGS. 1 and 4, the inside of the reaction vessel 11 was supplied with N$_2$ gas-CO gas mixture at flow rate of 200 sccm to bring the pressure in the reaction chamber 11 to 931 hPa (700 Torr), and the crystal-growth vessel 12 and crystal-growth compartment 24 were heated to bring the temperature (corresponding to the temperature at which the AlN source 1 was sublimated) of the under side of the crystal-growth vessel 12 to 2000° C., and to bring the temperature (corresponding to the temperature at which the AlN crystal 4 was grown) of the top side of the crystal-growth vessel 12 to 1900° C., and then the AlN crystal was grown. Herein, the ratio of the CO gas partial pressure to the total pressure of the gas (corresponding to above gas mixture) in the reaction chamber 11 was made $1\times10^{-4}$. Under the conditions in this embodiment, Al gas partial pressure is extremely small, compared with N$_2$ gas partial pressure. As a result, the ratio of the CO gas partial pressure to the total pressure of the gas in the crystal-growth compartment 24 is approximately $1\times10^{-4}$. The time required to grow crystal was 30 hours. After the crystal growth, the AlN crystal was cooled to room temperature (for example, 25° C.), and was removed from the crystal-growth compartment 24.

The produced AlN crystal, which was 48.8 mm in diameter×3 mm in thickness, was large in diameter, and was a single crystal with preferable morphology. The crystallinity of the AlN single crystal was also preferable because the full-width at half-maximum of diffraction peak in an XRD (X-ray diffraction) rocking curve along its (0002) face was 100 arcsec. Moreover, the carbon atom concentration in the AlN crystal was $4\times10^{16}$ atoms·cm$^{-3}$.

Embodiment 5

Apart from making the ratio of the CO gas partial pressure to the total pressure of the gas mixture 0.01 to bring the ratio of the CO gas partial pressure to the total pressure of the gas in the reaction chamber 11 to 0.01, the AlN crystal was grown in the same manner as in Embodiment 4. Herein, under the conditions in this embodiment, the Al gas partial pressure is extremely small, compared with the N$_2$ gas partial pressure. As a result, the ratio of the CO gas partial pressure to the total pressure of the gas in the crystal-growth compartment 24 is approximately 0.01.

The produced AlN crystal, which was 48.8 mm in diameter×3 mm in thickness, was large in diameter, and was a single crystal with preferable morphology. The crystallinity of this AlN single crystal was also preferable because the full-width at half-maximum of diffraction peak in an XRD (X-ray diffraction) rocking curve along its (0002) face was 100 arcsec. Moreover, the carbon atom concentration in the AlN crystal was $1.5\times10^{18}$ atoms·cm$^{-3}$.

Embodiment 6

Apart from making the ratio of the CO gas partial pressure to the total pressure of the gas mixture 0.85 to bring the ratio of the CO gas partial pressure to the total pressure of the gas in the reaction camber 11 to 0.85, the AlN crystal was grown in the same manner as in Embodiment 4. Herein, under the conditions in this embodiment, the Al gas partial pressure is extremely small, compared with the N$_2$ gas partial pressure. As a result, the ratio of the CO gas partial pressure to the total pressure of the gas in the crystal-growth compartment 24 is approximately 0.85.

The produced AlN crystal, which was 48.8 mm in diameter×3 mm in thickness, was large in diameter, and was a single crystal with preferable morphology. The crystallinity of this AlN single crystal was also preferable because the full-width at half-maximum of diffraction peak in an XRD (X-ray diffraction) rocking curve along its (0002) face was 100 arcsec. Moreover, the carbon atom concentration in the AlN crystal was $7\times10^{19}$ atoms·cm$^{-3}$.

Embodiment 7

Apart from making the ratio of the CO gas partial pressure to the total pressure of the gas mixture 0.95 to bring the ratio of the CO gas partial pressure to the total pressure of the gas in the reaction camber 11 to 0.95, the AlN crystal was grown in the same manner as in Embodiment 4. Herein, under the conditions in this embodiment, the Al gas partial pressure is extremely small, compared with the N$_2$ gas partial pressure. As a result, the ratio of the CO gas partial pressure to the total pressure of the gas in the crystal-growth compartment 24 is approximately 0.95.

Although the produced AlN crystal, which was 48.8 mm in diameter×3 mm in thickness, was large in diameter, its morphology was adversely affected, and its polycrystallization was found. Moreover, the carbon atom concentration in the AlN crystal was $3.2\times10^{20}$ atoms·cm$^{-3}$.

Embodiment 8

The reaction chamber 11 was supplied with the $N_2$ gas-$CO_2$ gas mixture at flow rate of 200 sccm to bring the pressure in the reaction chamber 11 to 931 hPa (700 Torr), and the crystal-growth vessel 12 and crystal-growth compartment 24 (refer to FIG. 4) were heated to bring the temperature (corresponding to the temperature at which the AlN source 1 was sublimated) of the bottom side of the crystal-growth vessel 12 to 2000° C., and to bring the temperature (corresponding to the temperature at which the AlN crystal 4 was grown) of the top side of the crystal-growth vessel 12 to 1900° C., and then the AlN crystal was grown. Herein, the ratio of the $CO_2$ gas partial pressure to the total pressure of the gas (corresponding to above gas mixture) in the reaction chamber 11 was made 0.01. Under the conditions in this embodiment, the Al gas partial pressure is extremely small, compared with the $N_2$ gas partial pressure. As a result, the ratio of the $CO_2$ gas partial pressure to the total pressure of the gas in the crystal-growth compartment 24 is approximately 0.01. The time required to grow crystals was 30 hours. After the crystal growth, the AlN crystal was cooled to room temperature (for example, 25° C.), and then was removed from the crystal-growth compartment 24.

The produced AlN crystal, which was 48.8 mm in diameter×3 mm in thickness, was large in diameter, and was a single crystal with preferable morphology. The crystallinity of this AlN single crystal was also preferable because the full-width at half-maximum of diffraction peak in an XRD (X-ray diffraction) rocking curve along its (0002) face was 100 arcsec. Moreover, the carbon atom concentration in the AlN crystal was $5 \times 10^{18}$ atoms·$cm^{-3}$.

Embodiment 9

Apart from making the ratio of the $CO_2$ gas partial pressure to the total pressure of the gas mixture 0.95 to bring the ratio of the $CO_2$ gas partial pressure to the total pressure of the gas in the reaction chamber 11 to 0.95, the AlN crystal was grown in the same manner as in Embodiment 8. Herein, under the conditions in this embodiment, the Al gas partial pressure is extremely small, compared with $N_2$ gas partial pressure. As a result, the ratio of the $CO_2$ gas partial pressure to the total pressure of the gas in the crystal-growth compartment 24 is approximately 0.95.

Although the produced AlN crystal, which was 48.8 mm in diameter×3 mm in thickness, was large in diameter, its morphology was adversely affected, and polycrystallization was discovered therein. Moreover, the carbon atom concentration in the AlN crystal was $5.4 \times 10^{20}$ atoms·$cm^{-3}$.

Comparative Example 1

Apart from supplying the reaction chamber 11 with the only $N_2$ gas with supplying neither CO gas nor $CO_2$ (that is to say, the ratios of the CO gas and $CO_2$ gas partial pressures to the total pressure of the gas in the reaction chamber 11 was respectively made substantially 0), the AlN crystal was grown in the same manner as in Embodiment 7.

The area in which the AlN crystal dose not grow was recognized on the seed crystal substrate 2, and the morphology of the produced AlN crystal was adversely affected, and polycrystallization was discovered therein.

Embodiment 10

The AlN crystal produced in the Embodiment 1 was sliced paralleling the front side of the seed crystal substrate, and after the sliced principal face was polished, a damaged layer caused by polishing was etched and removed to produce the AlN crystal substrate 30 mm in diameter×1 mm in thickness. The AlN crystal, whose principal face within 10μ square has root mean square (RMS: the square root of average of the squared deviation between the average plane and the profiling surface) roughness of 50 nm (500 Å) or less, was applicable to various types of semiconductor devices. The RMS was measured by atomic force microscope (AFM).

Embodiment 11

The AlN crystal produces in Embodiment 2 was sliced, polished, and etched, in the same manner as in Embodiment 8, to produce the AlN crystal substrate 30 mm in diameter×1 mm in thickness. The AlN crystal substrate, whose principal face within 10-μm square has RMS surface roughness of 50 nm (500 Å) or less, was applicable to various types of semiconductor devices.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

The invention claimed is:

1. A method of growing AlN crystal to have a carbon-atom concentration of $1 \times 10^{15}$ atoms·$cm^{-3}$ to $1 \times 10^{20}$ atoms·$cm^{-3}$ inclusive, the AlN crystal growth method comprising:
   placing either an SiC seed crystal substrate or an AlN seed crystal substrate inside a crystal-growth compartment at a first end thereof, the crystal-growth compartment arranged within, at a spacing apart from, a crystal growth vessel, formed of graphite, provided within a reaction chamber, the spacing between the crystal-growth compartment and the crystal growth vessel forming a carbon-containing gas producing compartment, and the crystal-growth compartment having, at a second end thereof opposite the first end, an opening onto the carbon-containing gas producing compartment;
   placing an AlN source into the crystal-growth compartment along the second end thereof;
   growing the AlN crystal by sublimation of the AlN source onto the seed crystal substrate;
   reacting the AlN source with carbon in, as a supply source, the graphite forming the crystal growth vessel so as to generate a carbon-containing gas in the carbon-containing gas producing compartment; and
   through said opening supplying the carbon-containing gas from the carbon-containing gas producing compartment into the inside of the crystal-growth compartment during the sublimation growth of the crystal, at a partial pressure such that the ratio of the partial pressure of the gas containing carbon to a total pressure of gas inside the reaction chamber during crystal growth is between $2 \times 10^{-5}$ and 0.9 inclusive.

2. The AlN crystal growth method set forth in claim 1, wherein the gas containing carbon includes CO gas or $CO_2$ gas.

3. A method of growing AlN crystal to have a carbon-atom concentration of $1 \times 10^{15}$ atoms·$cm^{-3}$ to $1 \times 10^{20}$ atoms·$cm^{-3}$ inclusive, the AlN crystal growth method comprising:
   placing either an SiC seed crystal substrate or an AlN seed crystal substrate inside a crystal-growth compartment at a first end thereof, the crystal-growth compartment arranged within, at a spacing apart from, a crystal growth vessel, formed of graphite, provided within a reaction chamber, the spacing between the crystal-growth compartment and the crystal growth vessel forming a carbon-containing gas producing compartment, and the crystal-growth compartment having, at a second end thereof opposite the first end, an opening onto the carbon-containing gas producing compartment;

placing an AlN source into the crystal-growth compartment along the second end thereof;

placing a metal oxide into the carbon-containing gas producing compartment;

reacting the metal oxide with carbon in, as a supply source, the graphite forming the crystal growth vessel so as to generate a carbon-containing gas in the carbon-containing gas producing compartment;

growing the AlN crystal by sublimation of the AlN source onto the seed crystal substrate; and through said opening supplying the carbon-containing gas from the carbon-containing gas producing compartment into the inside of the crystal-growth compartment during the sublimation growth of the crystal, at a partial pressure such that the ratio of the partial pressure of the gas containing carbon to a total pressure of gas inside the reaction chamber during crystal growth is between $2 \times 10^{-5}$ and 0.9 inclusive.

* * * * *